United States Patent [19]
Pelekanos

[11] Patent Number: 5,698,863
[45] Date of Patent: Dec. 16, 1997

[54] OPTICALLY CONTROLLED LIGHT MODULATOR DEVICE

[75] Inventor: Nikolaos Themelis Pelekanos, Grenoble, France

[73] Assignee: Commissariat a l'Energie Atomique, Paris, France

[21] Appl. No.: 434,679

[22] Filed: May 4, 1995

[30] Foreign Application Priority Data

May 6, 1994 [EP] European Pat. Off. .......... 94107158.1

[51] Int. Cl.$^6$ ............... H01L 29/06; H01L 31/0328; H01L 31/0336
[52] U.S. Cl. ............... 259/71; 257/13; 257/14; 257/18; 257/85; 257/190
[58] Field of Search ............... 257/13, 14, 18, 257/21, 85, 190

[56] References Cited

U.S. PATENT DOCUMENTS

| | | | |
|---|---|---|---|
| 4,952,792 | 8/1990 | Caridi | 257/21 |
| 5,160,993 | 11/1992 | Ishikawa et al. | 257/14 |
| 5,266,814 | 11/1993 | Inata et al. | 257/14 |
| 5,313,073 | 5/1994 | Kuroda et al. | 257/18 |
| 5,412,225 | 5/1995 | Dutta et al. | 257/21 |
| 5,432,123 | 7/1995 | Dentai et al. | 437/129 |
| 5,485,014 | 1/1996 | Jain et al. | 257/85 |
| 5,488,507 | 1/1996 | Nishimura | 257/18 |
| 5,521,397 | 5/1996 | Zhang | 257/18 |
| 5,521,398 | 5/1996 | Pelekanos et al. | 257/21 |
| 5,561,301 | 10/1996 | Inoue | 257/13 |

FOREIGN PATENT DOCUMENTS

| | | |
|---|---|---|
| 0 328 214 | 8/1989 | European Pat. Off. . |
| 0 478 060 | 4/1992 | European Pat. Off. . |

OTHER PUBLICATIONS

Reviews of Modern Physics, vol. 62, No. 1, pp. 173–234, Jan. 1, 1990, D.L. Smith, et al., "Theory of Semiconductor Superlattice Electronic Structure".

Appl. Phys Lett., vol. 59, No. 15, pp. 1832–1834, Oct. 7, 1991, A. Partovi, et al., "High Sensitivity Optical Image Processing Device Based on CdZnTe/ZnTe Multiple Quantum Well Structures".

Appl. Phys. Lett., vol. 63, No. 10, pp. 1358–1359, Sep. 6, 1993, G.W. Bryant, et al., "Determining Band Offset with Triple Quantum-Well Structures".

Applied Physics Letters, vol. 52, No. 8, pp. 637–639, Feb. 22, 1988, A. Kost, et al., "Large Optical Nonlinearities in GaAs/AlGaAs Hetero n–i–p–i Structure".

Primary Examiner—Carl W. Whitehead
Attorney, Agent, or Firm—Oblon, Spivak, McClelland, Maier & Neustadt, P.C.

[57] ABSTRACT

An optically controlled light modulator device, consisting of a semiconductor heterostructure with at least one quantum well layer and two strained barrier layers. The device is capable of modulating a first beam ("read" beam), through the Quantum Confined Stark Effect and the influence of a perpendicular electric field, produced all-optically by electrons and holes which are generated by the absorption, either of the first beam itself or of a second beam ("control" beam), and which are separated in opposite directions by the piezoelectric field of the barrier layers.

22 Claims, 3 Drawing Sheets

OPTICALLY CONTROLLED LIGHT MODULATOR DEVICE

DESCRIPTION

The invention relates to an electromagnetic radiation modulator device consisting of a semiconductor heterostructure and operating according to the principle of the Quantum-Confined-Stark-Effect (QCSE). More specifically, the invention relates to an all-optical electromagnetic radiation modulator in which the characteristics of a first beam of electromagnetic radiation is controlled by the electric field generated either by the first beam of electromagnetic radiation itself or a second beam of electromagnetic radiation.

The most efficient light-modulators demonstrated up-to-date are based on the Quantum-Confined-Stark-Effect (QCSE) in semiconductor heterostructures as e.g. described by D. A. B. Miller et al. in Phys. Rev. B 32, 1043 (1985). In this scheme, the multiple quantum well (MQW) segment of the heterostructure is subject to an external electric field. The optical constants in the vicinity of the MQW exciton resonance, such as index of refraction and absorption coeffiecient, are strongly affected by the presence of the electric field. Thus, a laser beam in resonance with the excitonic transition can be efficiently modulated by the mere action of the external electric field. An essential feature of these devices is that the excitonic resonance to be modulated is the ground state of the whole heterostructure. This avoids unnecessary losses on the read beam, and allows for realistic implementations in a waveguide or in resonant Fabry-Pérot cavity where excessive losses are detrimental. Another important feature of such devices is that the material choice can be made such that the active QW resonance spans the spectral region from the mid-infrared to the blue wavelengths, including around 1,55 μm, wavelength of minimal fiber loss of importance for telecommunications. However, in fabricating QCSE devices, electrical contacts have to be provided which can be difficult and time-consuming. Moreover, the need for electrical contacts reduces the device's integrability in a system and its possibility for miniaturization and pixelization.

It is therefore the main objective of the present invention to provide an electromagnetic radiation modulator device which operates according to the principle of the Quantum-Confined-Stark-Effect (QCSE) without the need for electrical contacts.

An electromagnetic radiation modulator device according to the present invention comprises a semiconductor heterostructure which contains at least a first quantum well layer of a first semiconductor material and two barrier layers of a second semiconductor material on either side of the quantum well layer, the device modulating a first beam of electromagnetic radiation through the influence of an electric field $E_2$ perpendicular to the layers according to the principle of QCSE, wherein the electric field $E_2$ is a field to be built up by electrons and holes generated by the absorption either, of the first beam of electromagnetic radiation itself, or of a second beam of electromagnetic radiation, and these electrons and holes are separated in opposite directions under the influence of an internal strain-induced piezoelectric field in the barrier layers.

In a preferred embodiment of the invention, the strain results from lattice-mismatch between the material of a considered semiconductor layer and the material of the substrate. In a further embodiment, the lattice-mismatch strain-induced piezoelectric field $E_1$ is perpendicular to the semiconductor layers. This static field $E_1$ can be effectively used to separate the optically generated charge carriers in opposite directions, which then build up the electric field $E_2$ for the QCSE. In a further embodiment of the invention, two more quantum well layers are provided symmetrically on both sides of the structure to collect the optically generated and separated charge carriers.

The present invention exploits thus also the QCSE but with one major advantage: the electric field necessary for the QCSE is photogenerated. Hence, there is no need for electrical contacts. This avoids delicate and time-consuming sample processing, as well as upgrades the device's integrability in a system and its possibility for miniaturization and pixelization. In addition, the essentially two-beam character of the device is particularly suitable for certain applications such as image processing.

It is worth noting that this device is sensitive and ultrafast. With proper design, its optical charging with a CW laser beam of 1 W/cm$^2$ occurs within μsec, which compares with the response of a SEED (self-electrooptic-effect-device) device for the same power level. Note that there is possibility to make the device response faster, e.g. 1 nsec, at the expense of increasing the power level of the writing beam. In pulsed laser excitation, the charging occurs on the nsec time scale whereas the lifetime of the photogenerated electric field is adjustable around or below 1 μsec.

In the following, a description of the principle of the invention and of some of its preferred embodiments is given in conjuction with the accompanying drawings, in which FIG. 1 shows valence (VB) and conduction band (CB) of an elementary cell of a preferred embodiment of the invention, with electron-hole photogeneration in the barriers;

It is well known, e.g. from D. L. Smith et al. in Rev. Mod. Phys. 62, 173 (1990), that in strained semiconductor heterostructures grown along a polar axis, such as for example along (111), the lattice-mismatch between an individual layer and the substrate induces strain which in turn generates a large static electric field $E_1$ (piezoelectric field) along the growth axis. We should note here, that by the term "substrate", we also refer to a semiconductor buffer layer which is epitaxially-grown on the substrate and is of different material than the one of the substrate. In this case and for a sufficiently high buffer layer thickness, it is the buffer layer that imposes strain on the heterostructure. The magnitude of this piezoelectric field can exceed 10$^5$ V/cm, for rather moderate lattice mismatch strains of ε=0.7%. The presence of such high piezoelectric fields in strained heterostructures can be exploited, in order to create an efficient all-optical modulator device.

Figure 1:
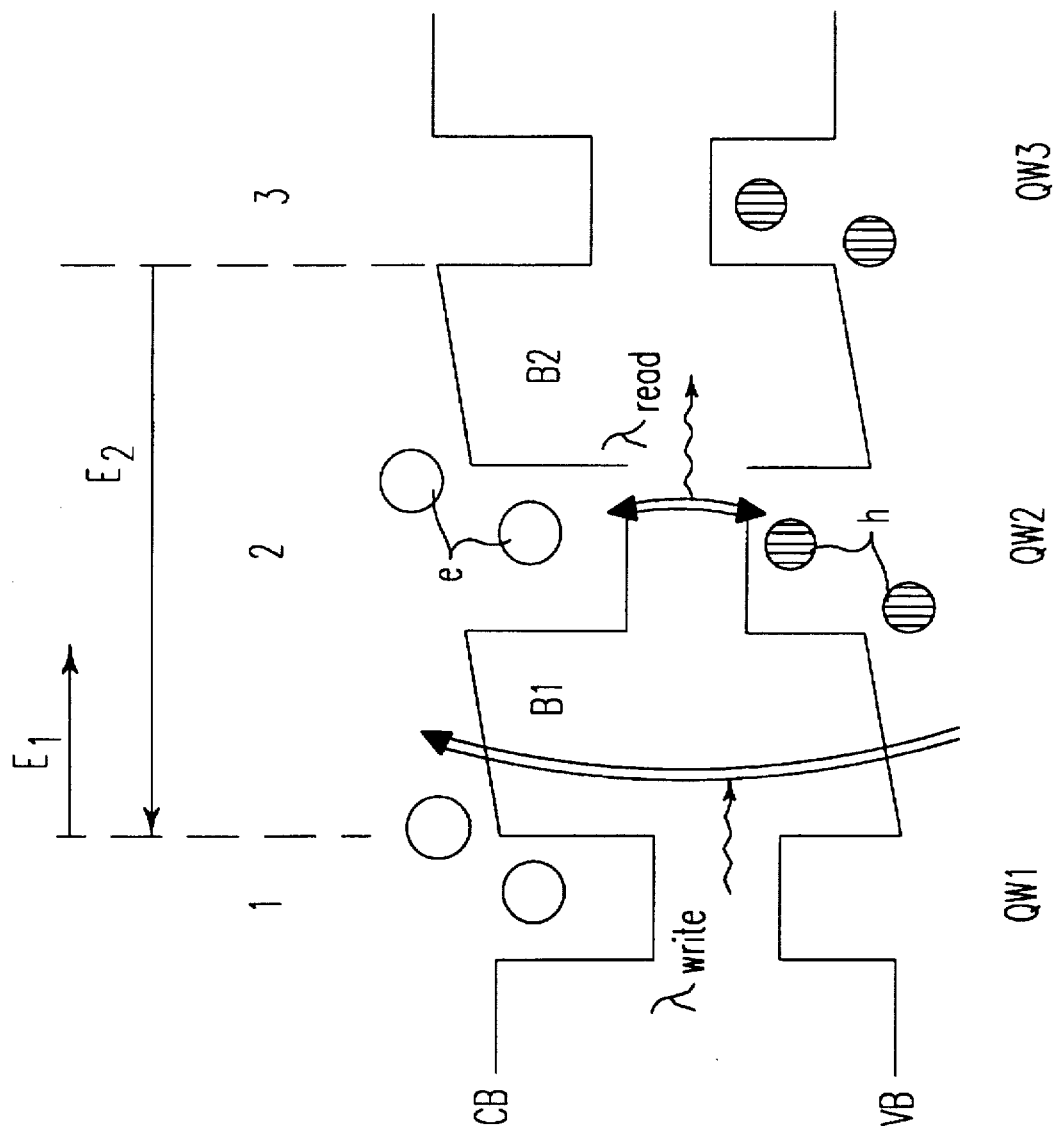

Here is an example of a preferred embodiment of the invention: the heterostructure is grown along a polar axis and consists of many periods of an elementary cell. A schematic of this cell is depicted in FIG. 1. The essential part of the device is a central QW2, on either side of which there exist barrier layers with piezoelectric field (on the left hand side, barrier B1, and on the right hand side, barrier B2).

QW2 is the active QW, i.e. the QW of which the optical properties are to be modulated by the charge separating action of B1 and B2, as will be explained next. In the scheme of FIG. 1, we also include QW1 and QW3 featuring as the electron and hole collection QWs, respectively.

This heterostructure may be implemented in a waveguide geometry or in a Fabry-Perot cavity in a manner similar to that described in the prior art. The modulator device can be used as an optically commanded spatial light modulator with a command beam containing two-dimensional image information or addressing individual pixels. The modulator device can also be used as an all-optical photorefractive quantum well device with a command beam which consists of interference fringes and another beam which is diffracted at the fringes.

In describing the principle of operation of this device we distinguish the following two cases:

CASE 1. Excitation in the Barriers

A control optical beam $\lambda_{write}$ with photon energy larger than the bandgap of the barrier layers, photogenerates electron-hole pairs throughout the elementary cell. The electrons and holes created at the barrier layers, however, experience the piezoelectric field $E_1$ which strongly separates them in opposite directions of the barrier layer. For instance, the electrons generated in the barrier layer B1 of FIG. 1 will relax in QW1 whereas the holes in QW2. Similarly, electrons and holes from B2 will pour in QW2 and QW3, respectively. Thus, in QW2 we find equal populations of electrons and holes at all times which allows them to deplete rapidly by radiative recombination occurring on the time scale of $\tau=1$ nsec. This is not the case for an excess electron in QW1, for example. The absence of the corresponding hole due to the filtering action of the barrier layer precludes the possibility of rapid recombination. The same holds for the excess holes in QW3. The end result of these dynamics is an accumulation of electron and hole populations in the collection QWs. The stored charges create an electrostatic field $E_2$ which modulates the excitonic resonance of the active QW2, through the QCSE. An optical beam $\lambda_{read}$, with a photon energy tuned in the vicinity of the QW2 exciton, reads the effect of the control beam on the resonance through the changes in the absoprtion coefficient and the index of refraction.

CASE 2. Resonant Excitation in QW2

In this operation scheme, the control optical beam $\lambda_{write}$ corresponds to a photon energy smaller than the bandgap of the barrier layers, and photogenerates electron-hole pairs preferentially in QW2. Due to the high piezoelectric field $E_1$ in the barrier layers the electrons and holes of the QW2 can rapidly escape from QW2, before they radiatively recombine in $\tau=1$ nsec. With proper design of the heterostructure parameters and selection of the wavelength of excitation $\lambda_{write}$, it is possible to reduce the escape times on the psec time scale. The electrons will escape towards QW1 (see FIG. 1) which provides the lowest electron level in the period (due to the band bending produced by the piezoelectric field). Similarly, the holes will escape towards QW3 which provides the lowest hole level. The stored charges create an electrostatic field $E_2$ which modulates the excitonic resonance of the active QW2, through the QCSE. An optical beam $\lambda_{read}$, with a photon energy tuned in the vicinity of the QW2 exciton, reads the effect of the control beam on the resonance through the changes in the absoprtion coefficient and the index of refraction. One particularly interesting aspect of this operation scheme is the possibility of one-beam operation, i.e. $\lambda_{write}=\lambda_{read}$, where the incident beam tuned in the vicinity of the QW2 exciton resonance photogenerates the electric field $E_2$ and "reads" itself the inflicted index and absorption changes (self-modulation).

For optimal device performance, the following should be considered:

(a) All strained layers of the heterostructure should preferably be kept below their respective critical thickness and the strain should preferably be symmetrized within the period. This will avoid the formation of misfit dislocations and allow a large number of periods.

(b) The piezoelectric potential should preferably be symmetrized within one period, to avoid a large built-up potential as the number of periods increases.

(c) The active QW should preferably be unstrained, thus without a piezoelectric field. The underlying idea here is that for the two-beam operation schemes a rapid recombination of the carriers in the active QW is desirable as a drainer of the carrier population which could be screening the electric field generated by the collected charge densities in the collection QWs. In the one-beam operation scheme, zero piezoelectric field in the active QW is desirable to avoid the weakening of the exciton oscillator strength by the electric field and maintain a large absorption coefficient.

(d) The piezoelectric barrier which acts as a quantum filter should preferably be absorbing at a photon energy lower than the substrate or the spacer layer separating two periods. This will maximize efficiency by avoiding absoption in the spacer layer.

(e) The active QW should preferably be the ground state of the whole structure. This is a major advantage as it was pointed out previously.

We now give a detailed description of two preferred embodiments of the present invention, namely two particular semi-conductor heterostructures, complying with the requirements of the previous section and in addition having the lowest exciton resonance at 1.55 μm. One is made of III–VI-semiconductor materials and the other of II–VI-semiconductor materials. The two systems are in many ways analogous except that the potential barrier heights are such that in the III–V-heterostructure the holes are much better trapped than the electrons whereas in the II–VI device the reverse occurs. This means than in designing the sample response time, different strategies should be followed in the two systems.

Figure 2:
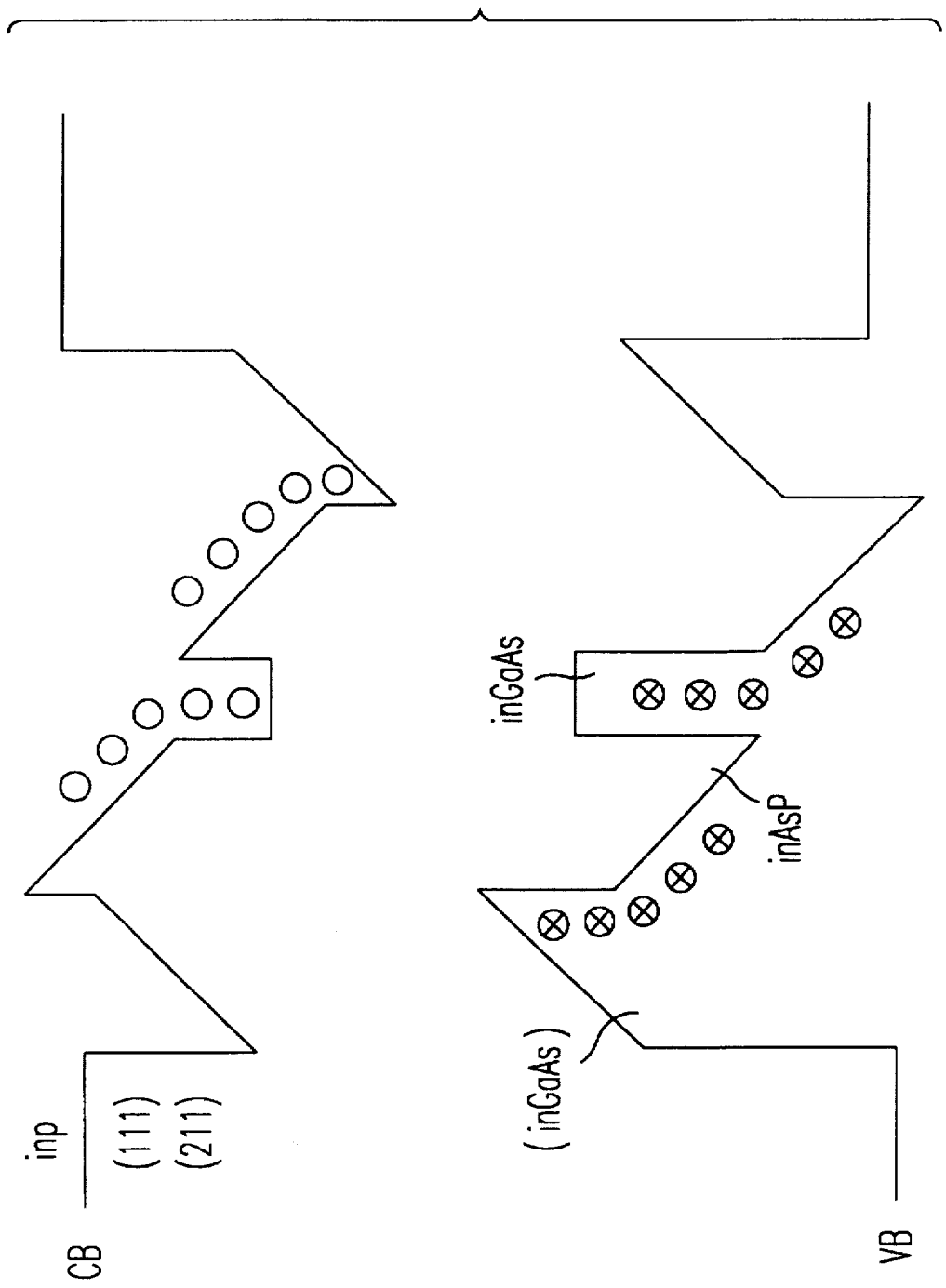
FIG. 2 shows valence (VB) and conduction band (CB) of an elementary cell of a preferred embodiment of the invention, consisting of a III–V semiconductor-heterostructure, with electron-hole photogeneration in the barriers.

The III–V device is grown on (111) or (211)-oriented InP substrates, the heterostructure segment contains many repetitions of the period shown in FIG. 2. The active QW is $In_{0.53}Ga_{0.47}As$, lattice matched with InP. Its thickness is adjusted to make the reading wavelength 1.55 μm and is typically less than 80A. The piezoelectric barriers are $InAs_{0.22}P_{0.78}$ and the collection QWs $In_{0.43}Ga_{0.57}As$. Their lattice mismatch with InP is +0.77% and –0.77% and their bandgap at T=300K, 1.07 and 0.82 eV, respectively. Their exact thickness and concentrations are chosen such that the strain and voltage buildup in one period is zero. The critical thickness for each individual layer and for ε=0.8% should be larger than 700A and the piezoelectric field of the order of $10^5$ V/cm. The conduction band discontinuity heights are from left to right 213, 78 and 123 meV. For holes, the corresponding values are 307, 172, and 237. These values are estimated neglecting strain. The effect of strain in the dilated QWs is a pushing-down of the electron and heavy-hole levels and a pushing-up of the light hole level, by about 20 meV. Note that the light hole level is the hole ground state in the collection QWs. In the compressed piezoelectric barriers the opposite occurs. The carrier escape times from the collection QWs give the order of magnitude of the response time of the device. If we neglect tunneling for sufficiently thick piezoelectric barriers, the only efficient escape process at room temperature is thermionic emission. An order of magnitude estimate of the thermionic emission times can be given as follows: For a collection QW thickness of 200A and at small photogenerated electric fields, we estimate the electron escape time to be 6 nsec whereas for the light hole 220 nsec. Note, however, that the thermionic emission escape times are strongly dependent on the QW and barrier thickness. For example, if we assume a 400A QW and barrier, the escape times are lengthened by a factor of 2000. Therefore, there is possibility to largely tune by design the time response of the device depending on our needs.

The III–V device may also use different materials. The active QW may be GaAs. The barriers may be AlGaInAs (quaternary). The collection quantum wells may be GaAsP. The substrate may be AlGaAs. The alloy concentrations and layer thickness of the collection and barrier layers may be adjusted so that the average drain and piezoelectric voltage is zero during an elementary period. All strained layer thicknesses are also kept below their critical thickness.

Figure 3:
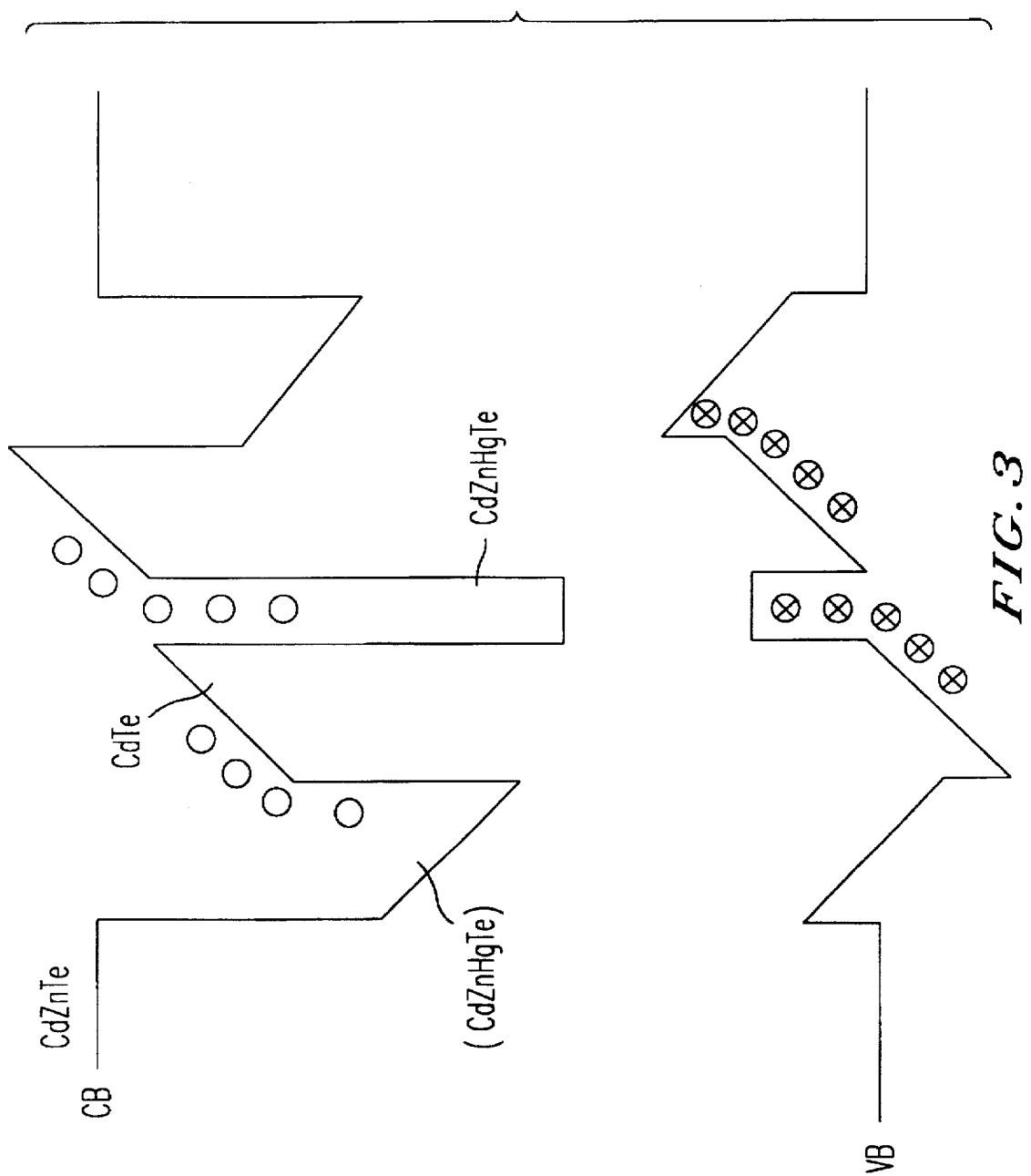
FIG. 3 shows valence (VB) and conduction band (CB) of an elementary cell of a preferred embodiment of the invention, consisting of a II–VI semiconductor heterostructure, with electron-hole photogeneration in the barriers.

The II–VI device as in FIG. 3 is grown coherently on (111)- or (211)-oriented $Cd_{0.96}Zn_{0.04}Te$ substrates. The active QW is 200A of $Cd_{0.61}Zn_{0.02}Hg_{0.37}Te$, lattice-matched with the substrate, and with an energy gap at 1.55 µm. The piezo-electric barriers are a few hundreds A of CdTe and the collection QWs a quaternary $Cd_{0.67}Zn_{0.08}Hg_{0.25}Te$. The lattice mismatch of CdTe with the substrate is +0.25% and the piezoelectric field about 50 kV/cm. The incorporation of Zn in the quaternaries is meant to adjust the lattice mismatch to be zero in the active QW, and −0.25% in the collection QWs. We estimate roughly (due to uncertainty in the valence band offset value in this system) and neglecting the effect of strain, the conduction band discontinuity heights to be from left to right 285, 270 and 525 meV. For holes, the corresponding values are 95, 90 and 175 meV. Compared to the III–V example, the situation here has been reversed in that the electrons are better confined than the holes, indicating longer carrier escape and device response times. We should emphasize, however, that longer response times mean also larger sensitivity, i.e. lower operation laser powers, and they should not be regarded necessarily as a drawback. Finally, notice in FIG. 2 the opposite sign of the piezoelectric field for the same sign of strain in the III–V as opposed to the II–VI device. This is due to the opposite-sign piezoelectric coefficients of II–VI materials compared to the III–V's.

The system of coupled rate equations describing our III–V heterostructure example in a steady-state photoexcitation experiment reads as follows:

$$\frac{dn_1}{dt} = G_1 + G_B - Cn_1p_1 - \frac{n_1}{\tau_0} + \frac{N_1}{\tau_{0h}}$$

$$\frac{dp_1}{dt} = G_1 - Cn_1p_1 - \frac{p_1}{\tau_{0h}} + \frac{N_1}{\tau_0}$$

$$\frac{dN_1}{dt} = Cn_1p_1 - N_1\left(\frac{1}{\tau_R} + \frac{1}{\tau_0} + \frac{1}{\tau_{0h}}\right)$$

$$\frac{dn_2}{dt} = G_2 + G_B - Cn_2p_2 - \frac{n_2}{\tau_e} + \frac{N_2}{\tau_h}$$

-continued $$\frac{dp_2}{dt} = G_2 + G_B - Cn_2p_2 - \frac{p_2}{\tau_h} + \frac{N_2}{\tau_e}$$

$$\frac{dN_2}{dt} = Cn_2p_2 - N_2\left(\frac{1}{\tau_R} + \frac{1}{\tau_e} + \frac{1}{\tau_h}\right)$$

$$\frac{dn_3}{dt} = G_3 - Cn_3p_3 - \frac{n_3}{\tau_0} + \frac{N_3}{\tau_{0h}}$$

$$\frac{dp_3}{dt} = G_3 + G_B - Cn_3p_3 - \frac{p_3}{\tau_{0h}} + \frac{N_3}{\tau_0}$$

$$\frac{dN_3}{dt} = Cn_3p_3 - N_3\left(\frac{1}{\tau_R} + \frac{1}{\tau_0} + \frac{1}{\tau_{0h}}\right)$$

where $n_i$, $p_i$, $N_i$ (i=1, 2, 3) are the electron, hole and exciton densities, respectively in the ith QW. The photogenerated carrier density rates in the ith QW are denoted by $G_i$ whereas in the piezoelectric barriers by $G_B$. C is the bimolecular exciton formation rate. The electron escape time from collection QW is $\tau_0$, whereas the light-hole escape time is denoted by $\tau_{0h}$. The escape times for electrons and heavy-holes in the active QW are $\tau_e$ and $\tau_h$. Finally, the exciton recombination time constant is $\tau_R$=1 nsec. Notice the preferential presence of the $G_B$ term for electrons in QW1 and for holes in QW3. This is the origin of the large charge densities that can be stored in the collection QWs. The escape times can be roughly estimated as explained for the III–V-example. The numerical integration of the above equations for a given set of time constants is a trivial task. A serious difficulty, however, arises from the fact that these escape times are field dependent.

For the purposes of the present description, it is instructive to assume a simple case where $\tau_0 = \tau_{0h}$ and $\tau_e = \tau_h$. It is also assumed that these escape times are independent of the electric field. Then the above equations simplify to:

$$\frac{dQ_1}{dt} = G_B - \frac{Q_1}{\tau_0}$$

$$\frac{dQ_2}{dt} = -\frac{Q_2}{\tau_e}$$

$$\frac{dQ_3}{dt} = G_B - \frac{Q_3}{\tau_0}$$

where $Q_i=abs(n_i-p_i)$ is the charge density in the ith QW. It follows that in the active QW the charge density is always zero, and that in the collection QWs within several time constants $\tau_0$ after the switch-on of the laser field the charge density reaches the values $Q_1=Q_2=G_B \tau_0$. Assuming an incident laser power density of 4 W/cm$^2$ of an Argon ion laser, we estimate the photogenerated carrier density rate in a 400A-thick piezoelectric barrier layer of absoprtion coefficient 5000 cm$^{-1}$ to be $G_B=4\times10^{17}$/cm$^2$sec. For $\tau_0=1$ µsec, $Q_1=4\times10^{11}$/cm$^2$. This charge density induces an electric field across the active QW of about 66 kV/cm, which is more than sufficient for QCSE modulation.

Let us now compare our device with a single piezoelectric QW, which has been proposed as an efficient nonlinear medium for modulation purposes. In a single piezoelectric QW, the photogenerated carriers tend to form a counteracting dipole inside the QW, generating an opposite screening electric field. However, experiment has shown that much larger power densities are needed. For example, from the work of Sela et al, Appl. Phys. Lett. 58, 684 (1991), one can infer that in order to screen 20% of a 141 kV/cm piezoelectric field, i.e. photogenerate a screening electric field of 25 kV/cm, an incident power density of 3 kW/cm$^2$ is needed.

This value is three orders of magnitude higher than the ones we estimated (even roughly) for the present device. This is most probably due to the fact that in the case of a piezoelectric QW the screening electron-hole pairs are continuously depleted due to recombination on the nsec time scale. As a consequence, the requirements in laser power densities in order to create sufficiently high carrier densities are dramatically increased.

Finally, another interesting aspect of our invention derives from the realization that, in addition to the optical generation of an electric field $E_2$, as explained above, there is always the possibility to apply simultaneously an external electric field $E_3$, by standard electrical contacts. This allows for interesting device situations such as, for example, a QW being subject simultaneously to a perpendicular electric field $E_2$, generated by all-optical means, and a parallel electric field $E_3$ applied by electrical contacts.

I claim:

1. Electromagnetic radiation modulator device comprising a semiconductor heterostructure which contains a substrate and at least a first quantum well layer of a first semiconductor material and two barrier layers of a second semiconductor material on either side of the first quantum well layer, the device capable of modulating a first beam of electromagnetic radiation through the influence of an electric field characterized in that the electric field is a field to be built up by electrons and holes which are generated by the absorption either, of the first beam of electromagnetic radiation itself, or of a second beam of electromagnetic radiation, and these electrons and holes are separated in opposite directions under the influence of an internal strain-induced piezoelectric field which is non-zero at least in the barrier layers.

2. The device according to claim 1, characterized in that the strain in a considered semiconductor layer of the heterostructure results from lattice-mismatch between the material of the considered semiconductor layer and the substrate material.

3. The device according to claim 2, characterized in that the internal strain-induced piezoelectric field is perpendicular to upper surfaces of the semiconductor layers.

4. The device according to claim 3, characterized by means to collect the optically generated and separated electrons and holes on either side of the first quantum well layer.

5. The device according to claim 4, characterized in that the means to collect are quantum well layers provided on either side of the first quantum well layer.

6. The device according to claim 5, characterized in that the quantum well layers are strained, the strain resulting from a lattice mismatch between the semiconductor material of the quantum well layers and the substrate material.

7. The device according to claim 1, characterized in that the lowest exciton resonance of the first quantum well layer is the ground state of the whole heterostructure.

8. The device according to claim 1, characterized in that the first beam of electromagnetic radiation is tuned in the vicinity of an exciton resonance of the first quantum well layer and the second beam of electromagnetic radiation has a larger photon energy than that of the first beam.

9. The device according to claim 1, characterized in that it operates only with the first beam of electromagnetic radiation, which is tuned in the vicinity of an exciton resonance of the first quantum well layer.

10. The device according to claim 5, characterized in that each layer material is a compound semiconductor having at least one element from periodic table group III and at least one element from periodic table group V.

11. The device according to claim 10, characterized in that the first beam has a wavelength of 1,55 µm and the first semiconductor material is InGaAs, the second semiconductor material is InAsP and the material of the quantum well layers is InGaAs and the substrate material is InP, the alloy concentrations and layer thicknesses of the quantum well, collection and barrier layers being adjusted such that the first semiconductor material is lattice-matched with the substrate material, the lowest exciton resonance of the first quantum well layer is at 1,55 µm, the average strain and piezoelectric voltage is zero within an elementary period and all strained layer thicknesses are kept below their critical thickness.

12. The device according to claim 10, characterized in that the first semiconductor material is GaAs, the second semiconductor material is AlGaInAs (quaternary), the material of the quantum well layers is GaAsP, and the substrate material is AlGaAs, the alloy concentrations and layer thicknesses of the collection and barrier layers being adjusted such that the average strain and piezoelectric voltage is zero within an elementary period and all strained layer thicknesses are kept below their critical thickness.

13. The device according to claim 5, characterized in that each layer material is a compound semiconductor having at least one element from periodic table group II and at least one element from periodic table group VI.

14. The device according to claim 13, characterized in that the first beam has a wavelength of 1,55 µm and the first semiconductor material is CdZnHgTe (quarternary), the second semiconductor material is CdTe and the material of the quantum well layers is CdZnHgTe and the substrate material is CdZnTe, the alloy concentrations and layer thicknesses of the quantum well, collection and barrier layers being adjusted such that the first semiconductor material is lattice-matched with the substrate material, the lowest exciton resonance of the first quantum well layer is at 1,55 µm, the average strain and piezoelectric voltage is zero within an elementary period and all strained layer thicknesses are kept below their critical thickness.

15. The device according to claim 1, characterized in that the heterostructure is implemented in a waveguide geometry.

16. The device according to claim 1, characterized in that the heterostructure is implemented in a Fabry-Pérot cavity.

17. The device according to claim 1, characterized in that the device is used as an optically commanded spatial light modulator, where the second beam is a command beam which contains two dimensional image information or addresses individual pixels of the device.

18. The device according to claim 1, characterized in that the device is used as all-optical photorefractive quantum well device, in that the second beam is a command beam which consists of interference fringes and the first beam is diffracted at the fringes.

19. The device according to claim 1, characterized in that the first and the second beam are continuous wave or pulsed laser beams.

20. Electromagnetic radiation modulator device comprising a semiconductor heterostructure which contains a substrate and at least a first quantum well layer of a first semiconductor material and two barrier layers of a second semiconductor material on either side of the first quantum well layer, the device capable of modulating a first beam of electromagnetic radiation through the influence of an electric field characterized in that the electric field is a field to be built up by electrons and holes which are generated by the absorption either, of the first beam of electromagnetic radiation itself, or of a second beam of electromagnetic radiation, and these electrons and holes are separated in opposite directions under the influence of an internal strain-induced piezoelectric field which is non-zero at least in the barrier layers wherein an additional external electric field is applied to the heterostructure.

21. The device according to claim 1, wherein the electric field is perpendicular to layers of the semiconductor heterostructure.

22. The device according to claim 21, wherein an additional external electric field, which is parallel to the layers, is applied to the semiconductor heterostructure by electrical contacts.

* * * * *